(12) United States Patent
McCollum

(10) Patent No.: US 10,034,397 B2
(45) Date of Patent: Jul. 24, 2018

(54) SYSTEM AND METHOD FOR SEISMICALLY STABILIZED UPS

(71) Applicant: Toshiba International Corporation, Houston, TX (US)

(72) Inventor: William Lewis McCollum, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 10 days.

(21) Appl. No.: 15/233,355

(22) Filed: Aug. 10, 2016

(65) Prior Publication Data

US 2018/0049333 A1 Feb. 15, 2018

(51) Int. Cl.
*H05K 5/02* (2006.01)
*H05K 7/18* (2006.01)
*H02J 9/06* (2006.01)

(52) U.S. Cl.
CPC ......... *H05K 5/0204* (2013.01); *H05K 5/0217* (2013.01); *H05K 7/183* (2013.01); *H02J 9/06* (2013.01)

(58) Field of Classification Search
None
See application file for complete search history.

(56) References Cited

U.S. PATENT DOCUMENTS

| | | | | |
|---|---|---|---|---|
| 4,700,923 A * | 10/1987 | Lewis, Jr. | ................. | F16M 3/00 248/500 |
| 4,973,110 A * | 11/1990 | Nyquist | ................. | A47B 47/03 108/187 |
| 5,566,521 A * | 10/1996 | Andrews | ................. | E04C 1/40 52/309.17 |
| 5,655,821 A * | 8/1997 | Laboch | ................. | A47B 91/08 248/680 |
| 6,027,190 A * | 2/2000 | Stewart | ................. | A47B 53/00 312/201 |
| 6,155,527 A * | 12/2000 | Muyskens | .......... | B65D 19/0002 108/51.3 |
| 6,669,314 B1 * | 12/2003 | Nemec | ................. | A47B 53/02 312/201 |
| 6,840,022 B1 * | 1/2005 | Manogue | ............... | A47B 53/00 211/162 |
| 6,840,591 B2 * | 1/2005 | Wessel | ................. | A47B 95/002 248/345.1 |
| 6,981,685 B1 * | 1/2006 | McHugh | ................. | F16M 5/00 248/188.1 |

(Continued)

*Primary Examiner* — Xanthia C Cunningham
(74) *Attorney, Agent, or Firm* — Baker Botts L.L.P.

(57) ABSTRACT

In accordance with presently disclosed embodiments, an seismically stabilized uninterruptable power supply (UPS) is provided. The UPS utilizes a series of rails coupled to the bottom of the UPS along with a bracket affixed to an external support surface to stabilize the UPS. The bracket may comprise two sides coupled to a bottom, wherein the sides are substantially parallel to each other and perpendicular to the bottom. The rails and bracket may further comprise a series of aligned openings such that when the rails and bracket are juxtaposed, they may be secured together through bolts. The external support surface may be a layer of cement or other sturdy material in which hardware is embedded. The embedded hardware may be either lagged into the surface or may be poured bar.

17 Claims, 3 Drawing Sheets

(56) References Cited

U.S. PATENT DOCUMENTS

| | | | | |
|---|---|---|---|---|
| 8,950,835 | B2* | 2/2015 | Pellin | H02B 3/00 |
| | | | | 246/1 R |
| 9,332,670 | B1* | 5/2016 | Eichelberg | H05K 7/1495 |
| 2002/0008188 | A1* | 1/2002 | Myers | E04G 17/045 |
| | | | | 249/47 |
| 2004/0150299 | A1* | 8/2004 | Keaton | A47B 53/02 |
| | | | | 312/201 |
| 2008/0190638 | A1* | 8/2008 | Le | H05K 5/0204 |
| | | | | 174/50 |
| 2009/0000526 | A1* | 1/2009 | Looker | B65D 88/12 |
| | | | | 108/57.12 |
| 2009/0134295 | A1* | 5/2009 | Sakakieda | H05K 5/0204 |
| | | | | 248/231.9 |
| 2011/0181159 | A1* | 7/2011 | Rangwala | H05K 7/18 |
| | | | | 312/223.1 |
| 2013/0075056 | A1* | 3/2013 | Fernandez | H04Q 1/025 |
| | | | | 165/45 |
| 2013/0264927 | A1* | 10/2013 | Seefeldt | A47B 91/005 |
| | | | | 312/351.1 |
| 2013/0294039 | A1* | 11/2013 | Chao | H05K 5/0204 |
| | | | | 361/752 |
| 2016/0007488 | A1* | 1/2016 | Neustadt | H01Q 1/246 |
| | | | | 455/552.1 |

* cited by examiner

SYSTEM AND METHOD FOR SEISMICALLY STABILIZED UPS

TECHNICAL FIELD

Embodiments of the present disclosure relate to uninterruptable power supplies, more particularly to systems and methods for securing and stabilizing said power supplies to external surfaces such that the power supplies are stackable side by side and are seismically stabilized.

BACKGROUND

An uninterruptible power supply, well known as a UPS, is typically used as a buffer between a commercially supplied power and an electrical load. Traditionally, a UPS is secured to an external surface with flared brackets. These flared brackets would extend out from underneath the UPS and increase the requisite surface area required to secure the UPS. This increase in surface area wastes valuable space in crowded facilities. This problem is compounded when several of these secured UPSs are used together. Therefore, developing alternative methods for securing UPSs is desirable.

SUMMARY

In accordance with the above, presently disclosed embodiments are directed to a UPS that is secured and seismically stabilized such that a plurality of UPSs may be stackable side by side.

In some embodiments, the secured UPS comprises a set of rails affixed to the underside of the UPS wherein the rails are affixed to a bracket and wherein the bracket is affixed to a support surface. The bracket comprises two parallel sides substantially perpendicular to the bottom. Furthermore, the rails of the UPS are affixed to the sides of the bracket via a series of bolts placed through aligned holes at predetermined positions in the sides of the bracket and rails.

The aforementioned UPS is secured in some embodiments by the following method. First, the bracket is affixed to the external surface. Second, the UPS is placed over the bracket such that the rails of the UPS lay flush with the sides of the bracket. Finally, the rails are affixed to the bracket.

BRIEF DESCRIPTION OF THE DRAWINGS

For a more complete understanding of the present disclosure and its features and advantages, reference is made to the following description, taken in conjunction with the accompanying drawings, in which.

DETAILED DESCRIPTION

Illustrative embodiments of the present disclosure are described in detail herein. In the interest of clarity, not all features of the actual implementation are described in this specification. It will of course be appreciated that in the development of any such embodiment, numerous implementation specific decisions must be made to achieve developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of this disclosure. Furthermore, in no way should the following examples be read to limit or define the scope of the disclosure.

Figure 1:
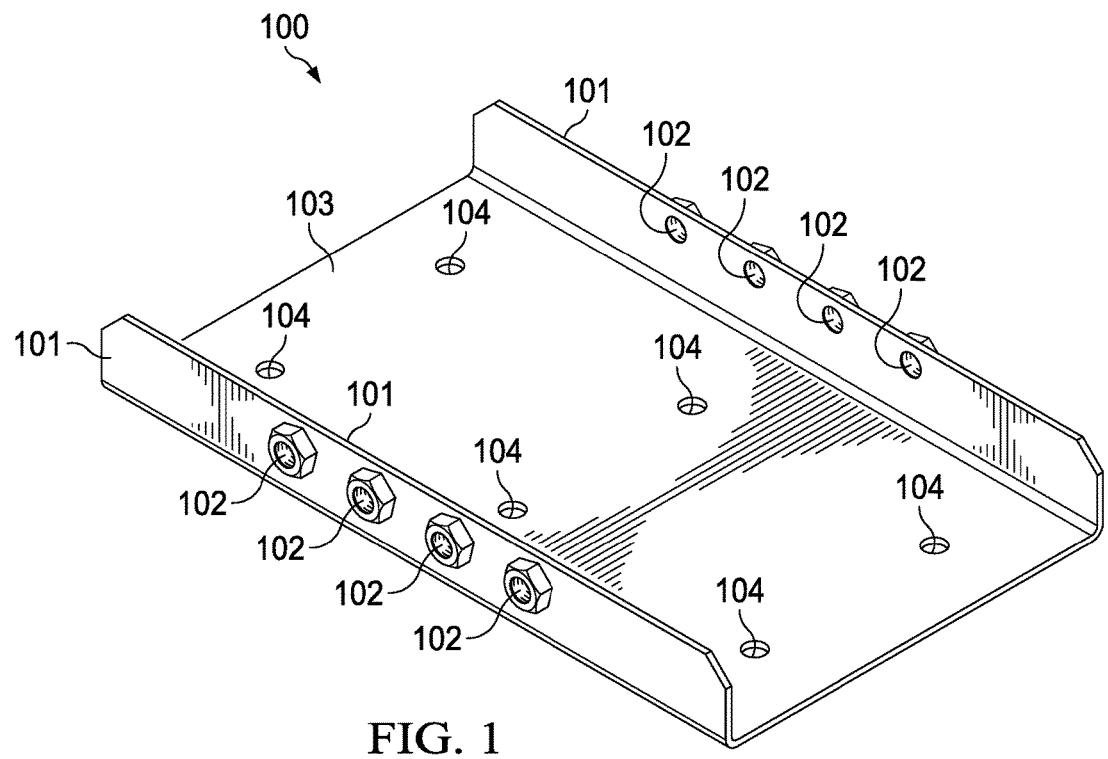
FIG. 1 is an illustrative view of the bracket used to secure the UPS, in accordance with an embodiment of the present disclosure.

Turning now to the drawings, FIG. 1 is an illustrative view of the bracket 100 used to secure a UPS. In some embodiments, the bracket 100 comprises galvanized or painted steel such that the bracket is resistant to corrosion. The thickness of the steel used to form the bracket may be no less than 3/16th of an inch thick. In some embodiments, the bracket may comprise 3/16th inch coated steel plate. In some embodiments, the bracket may comprise painted or galvanized steel. The bracket 100 comprises two sides 101 coupled to a bottom 103. The sides 101 are substantially parallel to one another. Furthermore, the sides 101 are substantially perpendicular to the bottom 103. In some embodiments, the sides 101 comprise the openings 102. The openings 102 are configured such that they may interface with any fastening mechanism known in the art. In some embodiments, the openings 102 may be configured such that bolts can be placed within the openings to engage flange fasteners. In some embodiments each side will comprise four openings 102 with hardware attached, and the said openings will be sized to accommodate 5/16-18 by 0.750 inch bolts. In some embodiments, the bottom 103 may comprise a series of openings 104. The openings 104 may be configured such that the bracket may be affixed to additional hardware. In certain embodiments, the openings 104 are configured such that the additional hardware may pass through the openings 104, and the bracket 100 may be subsequently affixed to said hardware. In certain embodiments, the hardware may comprise poured bar. In some embodiments the hardware may be lagged into an external support surface In some embodiments, the openings 104 may be sized to accommodate hardware a ½ inch in diameter.

Figure 2A:
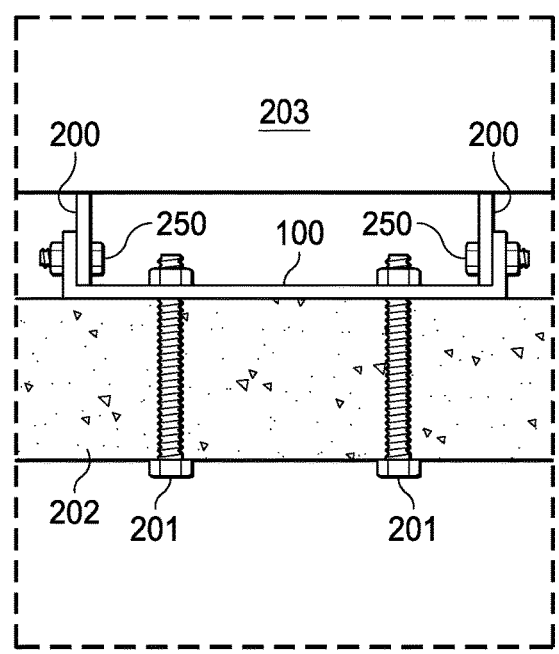
FIG. 2A is an cross sectional partial view of the interface between the UPS, the bracket, and the support surface.
Figure 2:
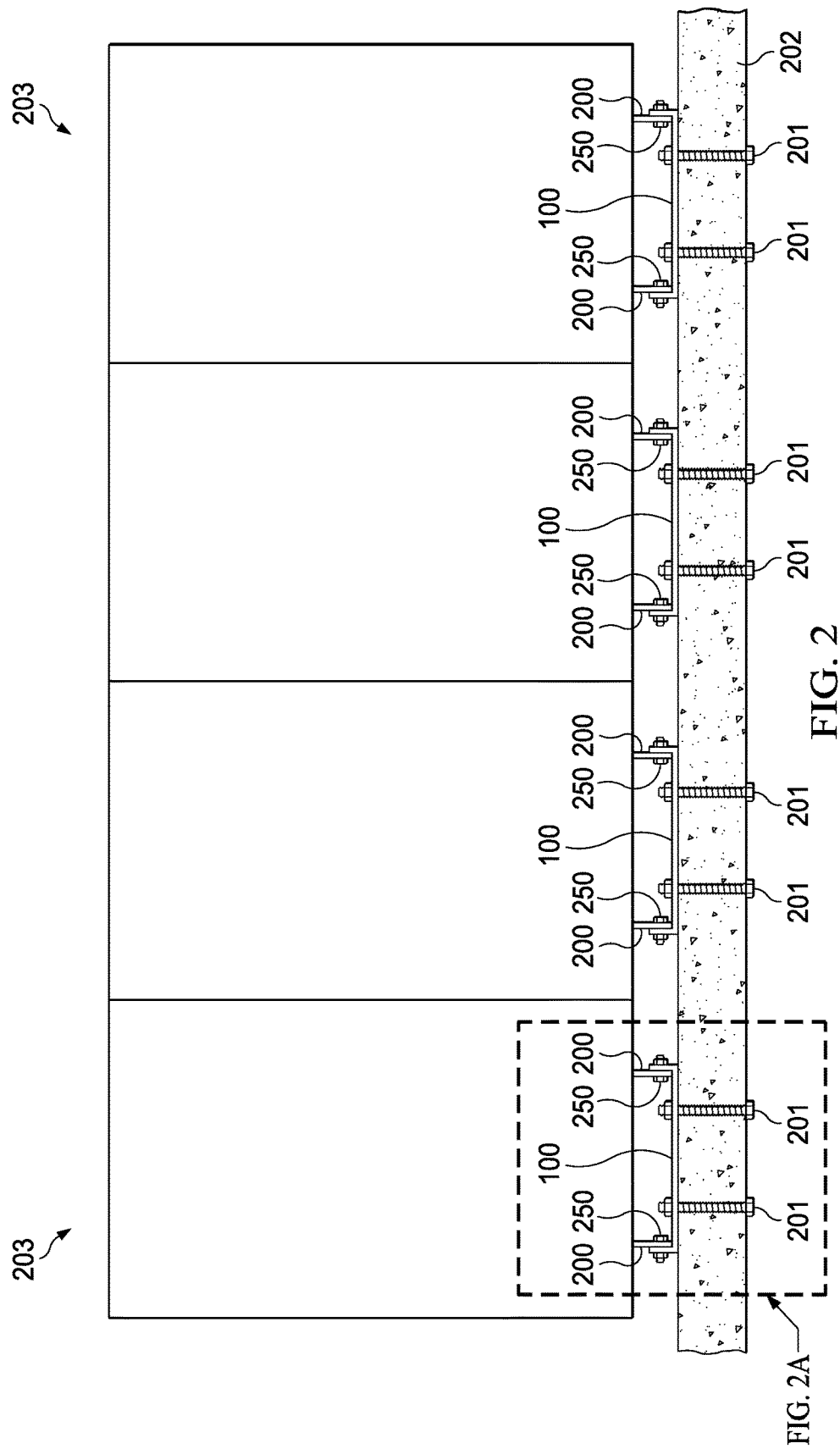
FIG. 2 is an illustrative view of multiple UPSs affixed to a support surface, in accordance with an embodiment of the present disclosure.

FIG. 2 is an illustrative view of multiple UPSs affixed to a support surface, in accordance with an embodiment of the present disclosure. The UPSs 203 comprises a plurality of rails 200. These rails 200 are affixed to the bottom of the UPSs 203. In some embodiments, the rails 200 may comprise a series of openings (300 in FIG. 3) through which the rails 200 may be affixed to the bracket 100. In some embodiments, the rails 200 may be part of the body of the UPS 203. In some embodiments, the rails 200 may be affixed to the UPS 203 by any method known in the art. In some embodiments the UPSs 203 may be placed flush against one another such that the UPSs are touching.

FIG. 2A is an cross sectional partial view of the interface between the UPS 203, the bracket 100, and the support surface 202. The UPS 203 sits upon its rails 200. These rails are placed flush against the bracket 100. The bracket 100 may be affixed to the rails 200 by a series of bolts 250. In some embodiments, the bolts 250 pass through the openings 102 and 300 and are fastened into place.

The bracket 100 may further be affixed to an external support surface 202 via hardware 201 which is affixed to the external support surface 202. In some embodiments, the external support surface 202 is a layer of concrete. In some embodiments, the hardware 201 is poured bar in the external support surface 202. Poured bar describes a process of placing the hardware 201 in the desired configuration and then pouring the concrete around said hardware to form the external support surface 202, such that the hardware 201 becomes affixed to the surface 202 as the concrete sets. In some embodiments, the hardware 201 is lagged into the external support surface 202. In some embodiments, the hardware 201 is lagged into the external support surface 202 by drilling hardware 201 into the external support surface 202. After the hardware 201 is affixed to the external support surface 202, the bracket 100 may be affixed to the hardware 201. The bracket is affixed to the external support surface 202 by placing the bracket on the external support surface 202 such that the bottom of the bracket 100 is flush against the external support surface 202, and the hardware 201 passes through the openings 104.

Figure 3:
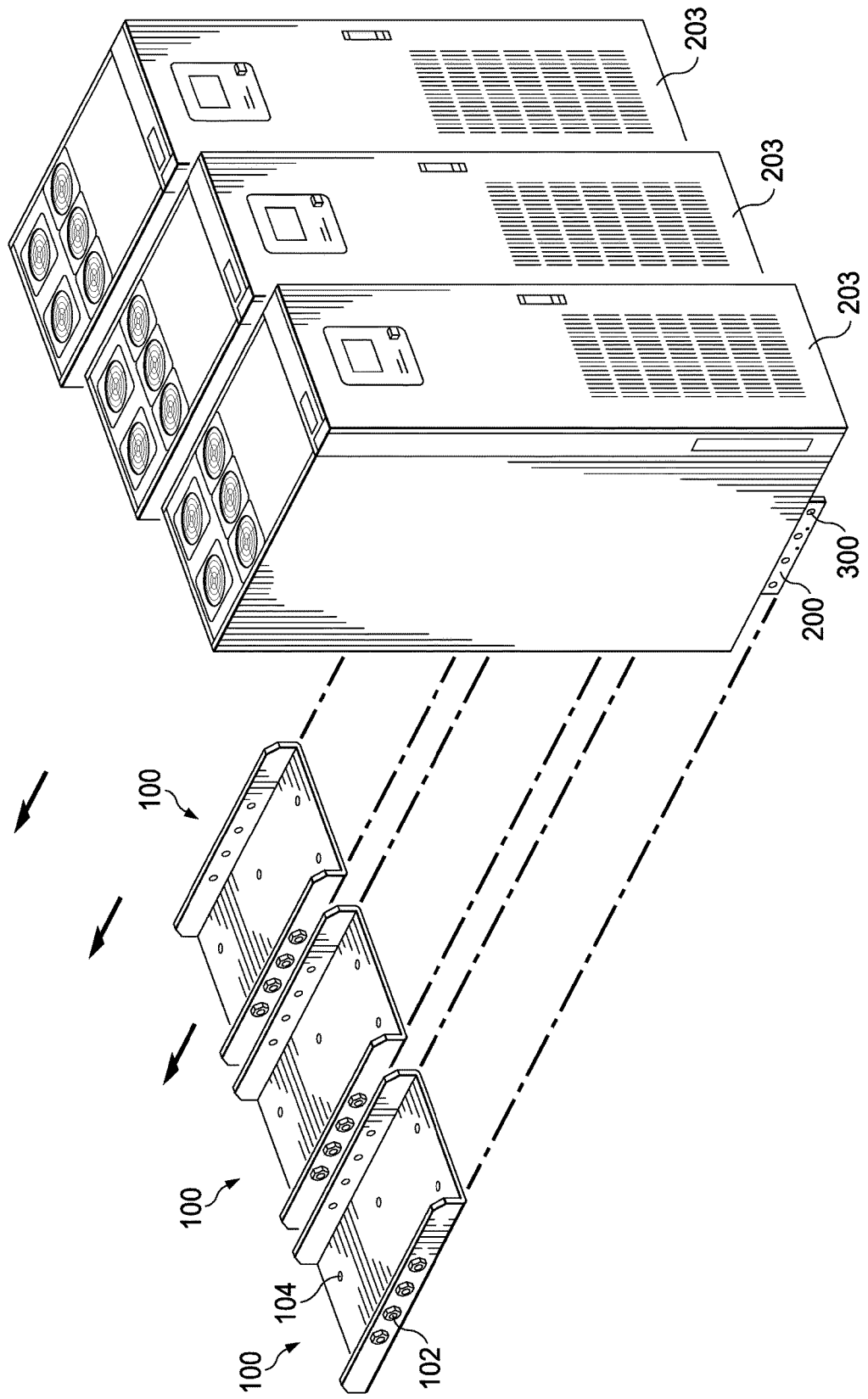
FIG. 3 is a schematic view of the installation of multiple UPSs affixed to a support surface.

FIG. 3 is a schematic view of the installation of multiple UPSs 203 affixed to a support surface 202. In this figure, the brackets 100 are already affixed to the external support surface 202 (via hardware 201 the openings 104 not shown here for clarity). After the brackets 100 are affixed to the external support surface 202, the UPSs 203 are moved atop the brackets 100. The UPSs are placed atop the brackets such that the openings 102 on bracket 100 are aligned with the openings 300 on the rails 200. After the openings are aligned, the bracket 100 is affixed to the rails 200 by placing bolts 250 through the aligned openings 300 and 200 as shown in FIG. 2A.

The system for forming this seismically stabilized UPS in some embodiments comprises the following steps. First the desired bracket is obtained. Second, the desired support surface is formed by placing the hardware in the desired configuration and pouring concrete around the hardware such that the hardware is affixed to the concrete. Third, the bracket is placed such that the hardware sticks through the openings in the bottom of the bracket. Fourth, the bracket is affixed to the hardware such that the bottom of the bracket sits flush with the concrete. Fifth, a UPS comprising a plurality of rails wherein the rails comprise a series of openings is placed above the bracket such that the openings of the rails are aligned with the openings on the sides of the bracket. Finally, the rails are affixed to the bracket by placing bolts through the aligned openings of the rails and the bracket. This process may be repeated as desired. Furthermore, the bracket and UPS may be configured such that multiple UPSs may be placed side by side as illustrated in FIG. 3.

It is to be noted that this method and system for securing the UPS allows a UPS to be affixed such that the UPS is seismically stabilized, wherein the UPS s affixed to an external support surface will be resistant to seismic shocks. Further, it is to be noted that this system does not require the UPS to be affixed to an external support surface of concrete. In some embodiments, the external support surface may be a wall or floor of a building. The UPS systems of this disclosure encompass systems in which the bracket and UPS are affixed to vehicle or shipping container. Affixing the UPS to a vehicle or shipping container through the methods of the present disclosure may provide advantages in shipping and moving UPSs.

The methods and systems of the present disclosure provide certain advantages over the prior art. In particular, the systems and methods provide for a seismically stabilized UPS that is fully stackable with other UPSs. The UPS of the present disclosure may sit flush against not only other UPSs but also against walls or other appliances. By comparison in the prior art, UPSs were secured with two outward facing brackets. These brackets were affixed to the UPS such that they required that the UPS sit at least six inches away from other UPSs, appliances, or walls.

Furthermore, the methods and systems of the present disclosure provide for a simple and quick installation process of a UPS. The systems and methods of the present disclosure allow one to simply affix a bracket onto an external surface. After affixing the bracket, the UPS is slid or rolled over the bracket such that the openings in the bracket align with the openings on the rails of the UPS, then the UPS is affixed by bolting the UPSs to the bracket. Furthermore, multiple UPSs can be installed in parallel by using this method. Several brackets can be affixed to the external surface and then several UPS s may be placed over and affixed to the brackets.

The present methods and systems provide a simpler and easier to install than the prior art. In the prior art, the UPS was bolted to two brackets and then the UPS along with the bracket was lowered onto the external support surface and affixed hardware. From a practical standpoint this is much more difficult, as the UPS and bracket must be lifted and placed upon the hardware, in comparison to the disclosed systems and methods where the bracket is set, and the UPS is simply rolled or slid onto the brackets, removing the need to lift, orient, and place the UPS.

Finally, the methods and systems of the present disclosure provide for a more durable seismically stabilized unit than the prior art. The present disclosure relies on a one piece design compared to the two piece design in the prior art. This one piece design is inherently much stronger as it holds the UPS from its center, whereas the prior art held the UPS from the sides.

Although the present disclosure and its advantages have been described in detail, it should be understood that various changes, substitutions and alterations can be made herein without departing from the spirit and scope of the disclosure as defined by the following claims.

What is claimed is:

1. A system for seismically stabilizing a UPS comprising:
   rails affixed on an underside of the UPS; and
   a bracket with a bottom surface affixed to a support surface, wherein the bracket comprises two parallel sides substantially perpendicular to the bottom, and wherein the rails of the UPS are affixed to the sides of the bracket via a series of bolts placed through aligned holes at predetermined positions in the sides of the bracket and rails;
   wherein the support surface further comprises a layer of concrete with hardware embedded in the concrete, said hardware engaging the bottom surface of the bracket via a series of holes in the bracket and affixing the bracket to the support surface; and
   wherein the hardware comprises poured bar.

2. The UPS of claim 1 further comprising a second UPS with second rails affixed on an underside of the second UPS located adjacent to and parallel to the UPS and a second bracket with a bottom surface affixed to the support surface located adjacent to and parallel to the bracket, wherein the second bracket comprises two parallel sides substantially perpendicular to the bottom, and wherein the rails of the second UPS are affixed to the sides of the second bracket via a series of bolts placed through aligned holes at predetermined positions in the sides of the second bracket and second rails.

3. The UPS of claim 1 wherein the support surface further comprises a wall of a shipping container.

4. The UPS of claim 1 wherein the hardware is lagged into the concrete.

5. The UPS of claim 1 wherein the bracket comprises a steel plate with a minimum thickness of 3/16th of an inch.

6. The UPS of claim 1 wherein the bracket comprises painted or galvanized steel.

7. The UPS of claim 1 wherein each rail and each side of the bracket comprise 4 openings configured to engage with 5/16-18 by 0.750 inch bolts.

8. A method of affixing a UPS to an external surface comprising:
   providing a UPS;
   providing a bracket wherein the bracket comprises two sides and a bottom, wherein the each side is parallel to the other side and both sides are perpendicular to the bottom;
   providing an external surface;
   affixing the bottom of bracket to the external surface;
   placing the UPS over the bracket;
   affixing the sides of the bracket to the UPS;
   providing an external support surface wherein the support surface comprises poured bar hardware; and
   using the hardware to affix the bracket to an external surface.

9. The method of claim 8 additionally comprising lagging hardware into the external surface; and using the hardware to affix the bracket to the external surface.

10. The method of claim 8 wherein the external surface comprises a layer of concrete.

11. The method of claim 8 wherein the bracket provided comprises openings on its sides and bottom.

12. The method of claim 11 additionally comprising utilizing the openings on the bottom of the bracket to affix the bracket to an external surface and utilizing the openings on the sides of the bracket to affix the UPS to the bracket.

13. The method of claim 8 additionally comprising affixing multiple UPSs in parallel to one another such that the UPSs are adjacent to one another.

14. The method of claim 8 wherein the UPS comprises a series of rails wherein the rails comprise a series of holes.

15. The method of claim 14 additionally comprising affixing the rails of the UPS to the bracket through a series of aligned holes on both the rails and bracket.

16. The method of claim 8 wherein the bracket comprises 3/16th inch coated steel plate.

17. The method of claim 8 wherein the bracket the external support surface comprises a wall of a shipping container or building.

* * * * *